(12) United States Patent
Hudson et al.

(10) Patent No.: US 6,886,347 B2
(45) Date of Patent: *May 3, 2005

(54) WORKPIECE CHUCK WITH TEMPERATURE CONTROL ASSEMBLY HAVING SPACERS BETWEEN LAYERS PROVIDING CLEARANCE FOR THERMOELECTRIC MODULES

(75) Inventors: Douglas E. Hudson, Hopkinton, MA (US); Dana G. Butcher, Somerville, MA (US); Richard B. Gates, Norwood, MA (US); James Pelrin, Easton, MA (US)

(73) Assignee: Temptronic Corporation, Sharon, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/617,200

(22) Filed: Jul. 10, 2003

(65) Prior Publication Data

US 2004/0107704 A1 Jun. 10, 2004

Related U.S. Application Data

(63) Continuation-in-part of application No. 10/193,361, filed on Jul. 11, 2002, now Pat. No. 6,745,575.
(60) Provisional application No. 60/448,203, filed on Feb. 18, 2003.

(51) Int. Cl.[7] .......................... F25B 21/02; F25D 23/12
(52) U.S. Cl. ........................ 62/3.3; 62/259.2; 62/3.7
(58) Field of Search ................. 62/3.3–3.7, 259.2; 361/688, 704, 705, 707, 713; 136/204, 203

(56) References Cited

U.S. PATENT DOCUMENTS

| | | | |
|---|---|---|---|
| 4,493,939 A | 1/1985 | Blaske et al. ............... 136/212 |
| 4,667,522 A | 5/1987 | Kawahara .................. 73/865.6 |
| 4,685,853 A | 8/1987 | Roshala ..................... 414/404 |
| 5,220,277 A | 6/1993 | Reitinger ................... 324/158 |
| 5,465,578 A | * 11/1995 | Barben et al. ............... 62/3.2 |
| 5,584,183 A | 12/1996 | Wright et al. ................ 62/3.7 |
| 5,613,364 A | 3/1997 | Higgins ........................ 62/3.2 |
| 5,640,852 A | 6/1997 | Atlas ............................. 62/3.7 |
| 6,104,203 A | 8/2000 | Costello et al. ............. 324/760 |
| 6,134,892 A | 10/2000 | Turner et al. .................. 62/3.2 |
| 6,347,521 B1 | 2/2002 | Kadotani et al. ............. 62/3.7 |
| 6,378,321 B1 | 4/2002 | Epstein et al. ................ 62/264 |
| 6,700,052 B2 | * 3/2004 | Bell ............................ 136/201 |
| 2001/0003901 A1 | 6/2001 | Bolandi et al. ............... 62/3.7 |

FOREIGN PATENT DOCUMENTS

| | | | |
|---|---|---|---|
| EP | 0470459 | 7/1991 | .......... F04C/29/10 |
| EP | 0505981 | 3/1992 | .......... G01R/31/26 |
| EP | 0743530 | 11/1996 | .......... G01R/31/28 |
| EP | 0762480 | 12/1997 | .......... H01L/21/00 |
| WO | WO 01/01460 | 1/2001 | .......... H01L/21/00 |

* cited by examiner

*Primary Examiner*—Cheryl Tyler
*Assistant Examiner*—Filip Zec
(74) *Attorney, Agent, or Firm*—Mills & Onello LLP

(57) ABSTRACT

A workpiece chuck and method for supporting a workpiece such as a semiconductor wafer are described. The workpiece chuck includes an upper surface for supporting the wafer and a temperature control assembly in thermal communication with the upper surface to control temperature in the wafer. The temperature control assembly includes one or more thermoelectric modules between an upper and lower layers. One or more spacers between the upper and lower layers provide a space between the upper and lower layers such that the one or more thermoelectric modules vertically float in the space. That is, the upper and lower layers of the temperature control modules do not mechanically constrain the thermoelectric modules in the vertical direction. As a result, mechanical stresses on the thermoelectric modules due to temperature effects are substantially reduced or eliminated, resulting in much higher reliability of the chuck and the thermoelectric modules over temperature. Also, the spacers provided additional mechanical stability to the chuck, resulting in improved flatness of the chuck upper surface over temperature. To provide additional stability and improve performance over temperature, the thermoelectric modules can be made effectively smaller. This can be done by segmenting the modules into multiple segments or by providing a plurality of submodules connected together.

46 Claims, 12 Drawing Sheets

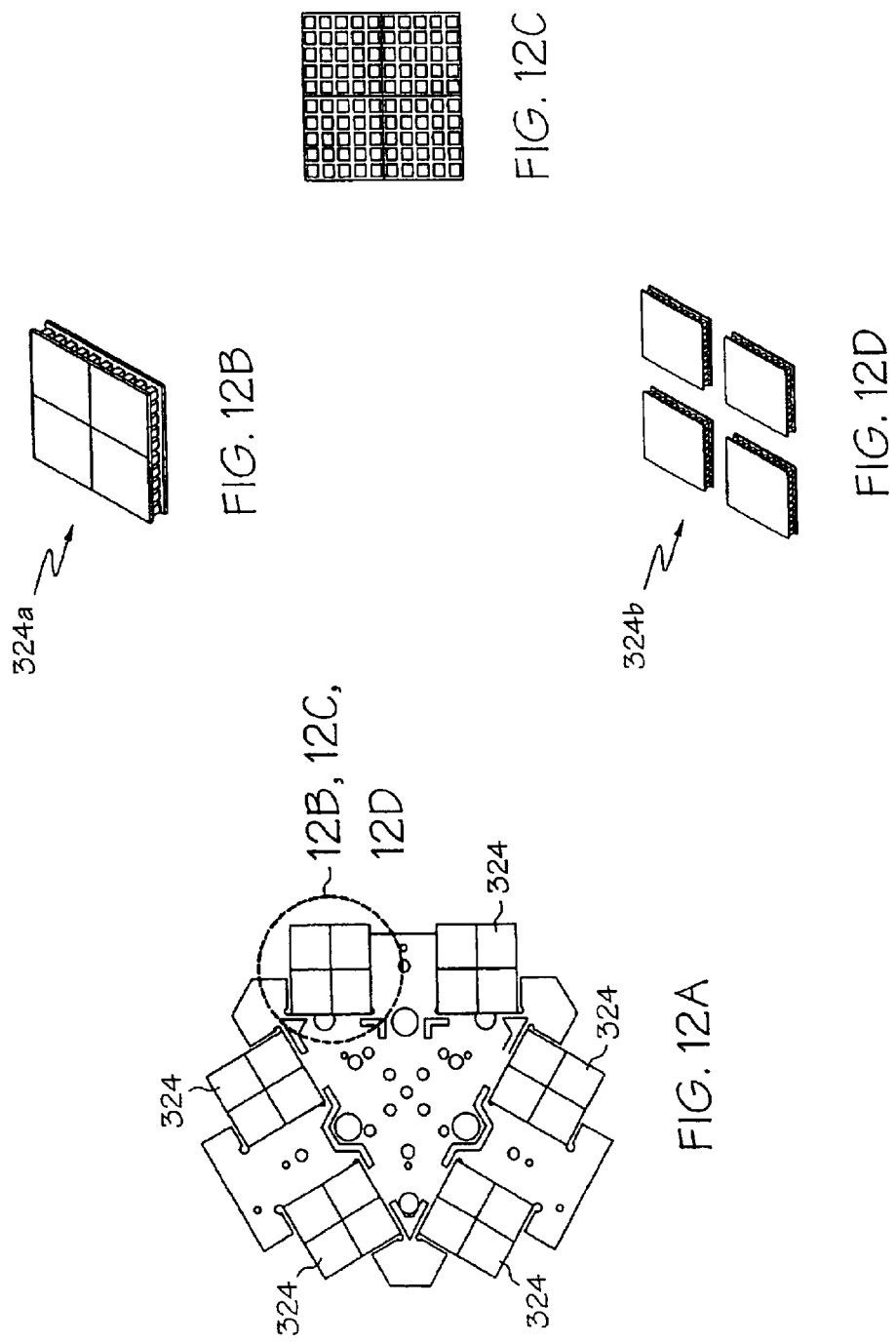

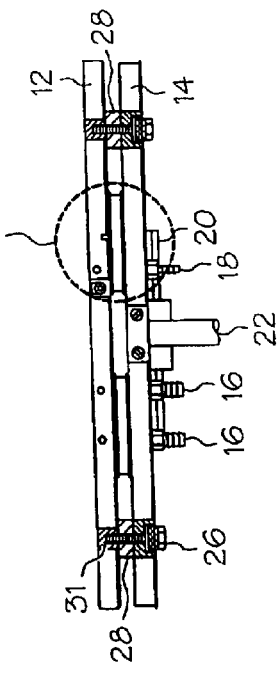
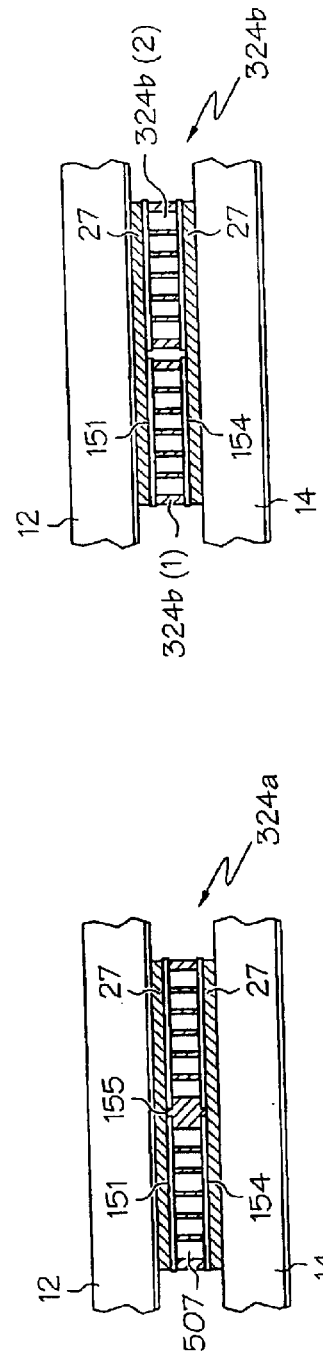

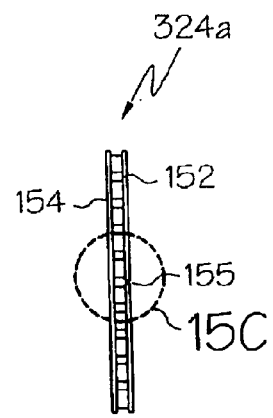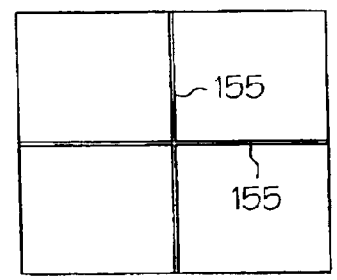
FIG. 15A          FIG. 15B
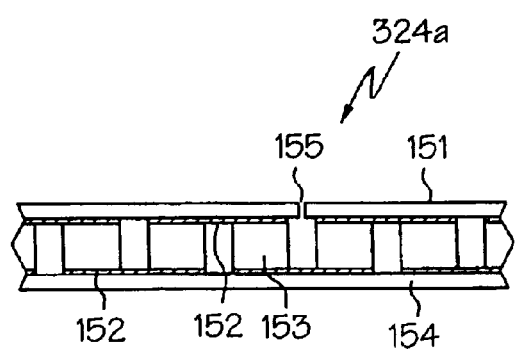
FIG. 15C

WORKPIECE CHUCK WITH TEMPERATURE CONTROL ASSEMBLY HAVING SPACERS BETWEEN LAYERS PROVIDING CLEARANCE FOR THERMOELECTRIC MODULES

RELATED APPLICATION

This application is a continuation-in-part of U.S. patent application Ser. No. 10/193,361, filed Jul. 11, 2002 now U.S. Pat. No. 6,745,575, of the same assignee as the assignee of the present application, the contents of which are hereby incorporated in their entirety by reference.

This application is based in part on U.S. Provisional Patent Application Ser. No. 60/448,203, filed Feb. 18, 2003, the contents of which are incorporated herein in their entirety by reference.

BACKGROUND OF THE INVENTION

In semiconductor wafer processing, it is often required to process and/or test a wafer over temperature. Temperature-controlled wafer chucks have been developed to support a wafer and cycle the wafer over temperature during testing and/or processing. In a typical temperature-controlled wafer chuck, a temperature control module such as a heater and heat sink assembly is provided as a layer in the chuck. A top surface on which the wafer is mounted is provided at the top of the heater and heat sink assembly, and a base by which the chuck is mounted to the host apparatus, e.g., wafer prober, is provided beneath the heater and heat sink assembly. In some heater/heat sink assemblies, thermoelectric modules, also known as Peltier devices, are used to provide the temperature control. Peltier devices are small solid-state devices that function as heat pumps. The typical device is a sandwich formed by two ceramic plates with an array of small bismuth telluride ($Bi_2Te_3$) cubes in between. When a DC current is applied, heat is moved from one side of the device to the other, where it is removed with a heat sink. The cold side of the device is commonly used to cool a wafer. If the current is reversed, the device can be used as a heater by moving heat in the opposite direction.

One drawback to Peltier devices is that they are subject to mechanical stresses. These stresses can come from different sources. In one case, mechanical stresses induced by expansion and contraction of chuck layers over temperature can cause the devices to become unreliable and eventually fail. This is particularly true in wafer chucks where the Peltier devices are rigidly attached to one or both of the upper and lower layers of the heater/heat sink assembly. As the assembly expands and contracts, the Peltier devices fail due to the mechanical stresses induced by thermal effects.

In another case, the mechanical stress induced by differential expansion of the ceramic top and bottom layers of the device itself can cause the devices to become unreliable and fail. This is particularly true if the Peltier modules are large in size. The larger devices create increased differential expansion and therefore develop more mechanical stress.

SUMMARY OF THE INVENTION

The present invention is directed to a workpiece chuck and method for supporting a workpiece such as a semiconductor wafer. The chuck includes a top layer on which the workpiece can be mounted and a temperature control assembly in thermal communication with the top layer to control temperature in the workpiece. The temperature control assembly includes an upper layer and a lower layer. At least one thermoelectric module is disposed between the upper and lower layers and at least one spacer is provided between the upper and lower layers. The spacer is sized to vertically space the upper and lower layers such that the thermoelectric module vertically floats in a space between the upper and lower layers. That is, the thermoelectric module is not mechanically or rigidly constrained within the temperature control assembly. In one embodiment, the smallest modules that can be employed in the construction of the chuck are used to reduce differential expansion within the modules themselves. As a result, mechanical stresses due to thermal effects are substantially reduced or eliminated.

In one embodiment, a thermally conductive medium is provided in the space between the upper and lower layers of the temperature control assembly. The thermally conductive medium thermally couples one or more thermoelectric modules to the upper and/or lower layers of the temperature control assembly. In one embodiment, the thermally conductive medium comprises a thermal heat sink grease. In another embodiment, the thermally conductive medium comprises a metallic foil. In another embodiment, the thermally conductive medium comprises a thermally conductive pad. In any of these embodiments, the thermally conductive medium is resilient and remains resilient throughout the operating temperature range of the chuck, such that the thermoelectric module is thermally coupled to the upper and/or lower layers while not being physically constrained between the upper and lower layers.

In one embodiment, the thermoelectric module is a Peltier device. The thermoelectric module can comprise bismuth telluride and has a segmented surface to reduce the effective size of the module.

The upper and lower layers of the temperature control assembly can be fastened together by one or more screws. In one embodiment, the spacer is actually a plurality of washer or bushing-type spacers which include clearance holes through which the screws pass. As the screws are tightened to fasten the upper and lower layers they capture the spacers between the layers, while allowing sufficient space to prevent the thermoelectric modules from being vertically constrained. In another embodiment, the spacer is a unitary device, instead of a washer or bushing-type device as in the previously mentioned embodiment. The unitary device can be made in a star shape in which multiple spacing arms extend radially from the center of the temperature control assembly toward its outer edges.

The present invention provides numerous advantages over prior configurations. By providing sufficient space between the layers of the temperature control assembly, the thermoelectric modules are not subject to mechanical stresses due to thermal expansion and contraction effects. Additionally, utilizing modules that are small reduces the differential expansion of the module ceramic surfaces. As a result, damage and failure of the devices is substantially reduced. Also, the spacers provide added rigidity and support in the wafer chuck, resulting in improved flatness of the top surface of the chuck, which in turn results in improved wafer processing and/or testing results.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 12 is a schematic detailed view of two embodiments of thermoelectric modules used in the workpiece chucks of FIGS. 6 through 11.

FIG. 13 contains schematic cross-sectional views of the thermoelectric module embodiments illustrated in FIG. 12.

FIG. 15 contains a schematic detailed cross-sectional view of a segmented thermoelectric module in accordance with the invention.

DETAILED DESCRIPTION OF THE PREFERRED EMBODIMENTS

Figure 1:
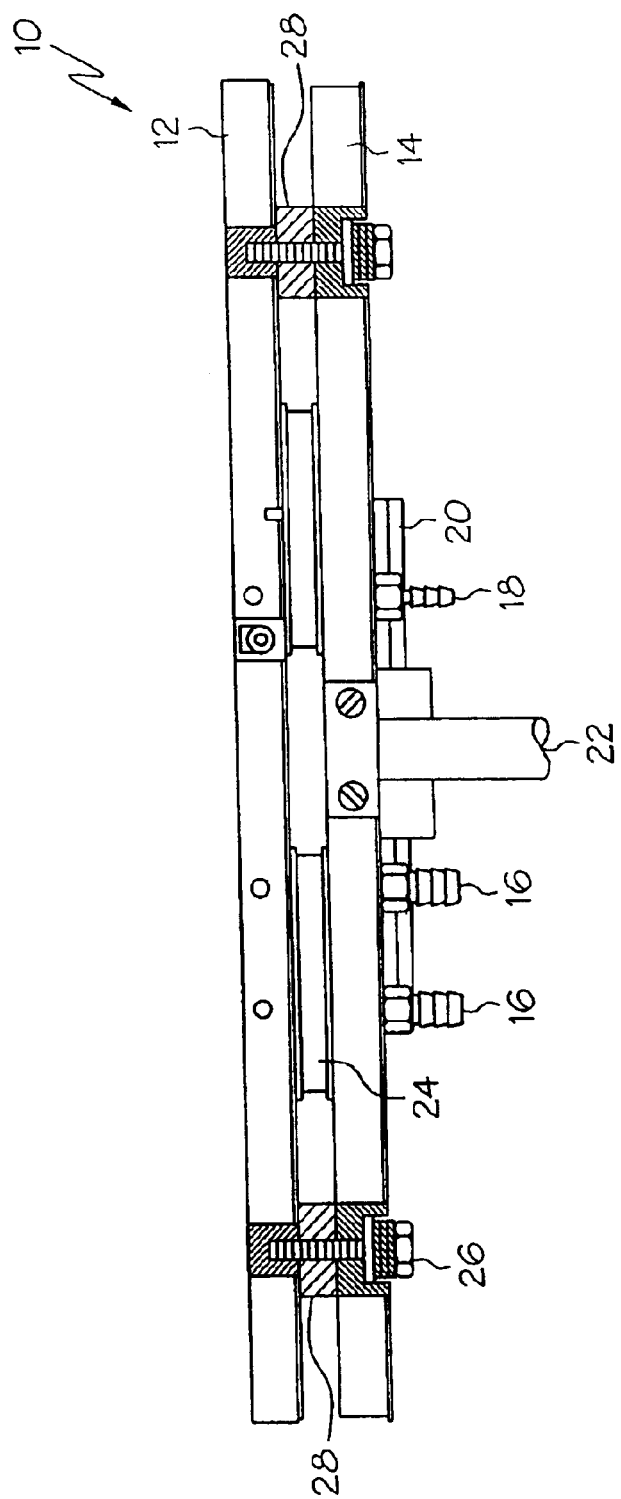
FIG. 1 is a schematic cross-sectional view of a workpiece chuck in accordance with one embodiment of the present invention.
Figure 2:
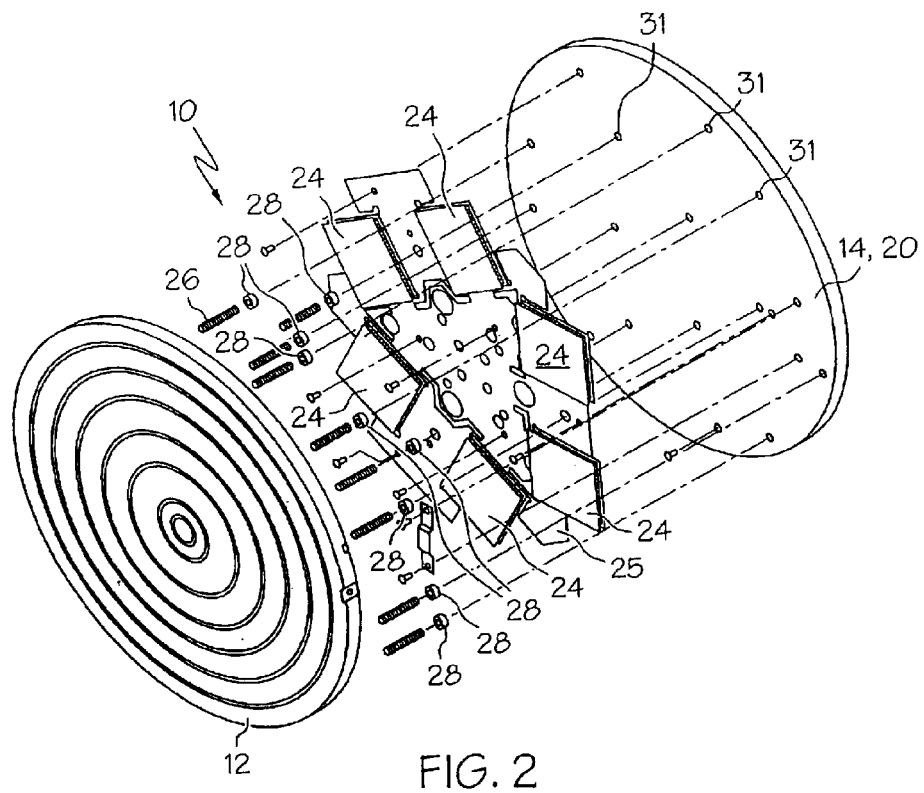
FIG. 2 is a schematic exploded view of a portion of the workpiece chuck of FIG. 1.
Figure 3:
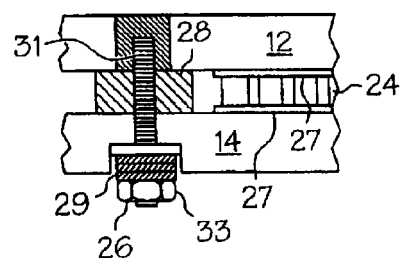
FIG. 3 is a schematic detail cross-sectional view of a portion of the workpiece chuck of FIGS. 1 and 2.

FIG. 1 is a schematic cross-sectional view of a workpiece chuck 10 in accordance with an embodiment of the invention. FIG. 2 is a schematic exploded view of the chuck 10 shown in FIG. 1. FIG. 3 is a schematic cross-sectional detailed view of a portion of the workpiece chuck 10 shown in FIGS. 1 and 2. Referring to FIGS. 1 through 3, the chuck 10 includes a top surface or vacuum plate 12 on which a workpiece such as a semiconductor wafer can be placed during processing. The top vacuum plate 12 includes concentric channels for distributing vacuum throughout the top surface to hold the wafer on the top surface. The chuck 10 also includes a heat sink or temperature control apparatus 14 fastened beneath the top vacuum 12 by one or more fastener stacks which include screws 26. Air/fluid coolant inlet and exit nozzles 16 are provided for circulating coolant fluid through the heat sink assembly 14. A vacuum inlet 18 is provided for providing vacuum to the chuck 10 to hold the wafer to the top surface 12. A mounting base 20 can be used to mount the chuck 10 to the host machine that is performing the wafer processing, such as, for example, a wafer prober machine.

An array of thermoelectric or Peltier modules 24 is provided in the space between the top plate 12 and the heat sink 14. The Peltier modules 24 can be of the type sold by Melcor of Trenton, N.J. The modules 24 are electrically connected to a printed circuit board 25 which is positioned between the top vacuum plate 12 and the heat sink assembly 14. The vertical spacing between the top plate 12 and the heat sink 14 is controlled by the size of the spacers 28. The spacers 28 are formed of a ceramic or similar non-conductive, low thermal expansion material. The vertical dimension of the spacers 28 is selected such that when the top plate 12 and the heat sink assembly 14 are fastened together by screws 26, the space between the top plate 12 and the heat sink assembly 14 is such that the Peltier modules 24 are free to move laterally. That is, the top plate 12 and heat sink assembly 14 do not clamp or mechanically constrain the Peltier modules 24 and the vertical direction. That is, the controlled dimension is such that the Peltier array is allowed to float during temperature transitions, thus effectively limiting mechanical stresses across the Peltier structure. This approach dramatically extends the life expectancy of the Peltier modules 24. A power/sensor cable 22 provides electrical power to the Peltier modules 24 and temperature and other sensing capabilities in the chuck 10.

The array of Peltier modules 24 is thermally coupled with the top vacuum plate 12 and the heat sink assembly 14 through a thermally conductive medium on the module surfaces. The thermally conductive transfer medium 27 is applied in the space between the top and bottom surfaces of the Peltier modules 24 and the top plate 12 and the heat sink assembly 14, respectively. The medium can be a thermal non-electrically-conductive heat sink grease, such as Premium Ceramic Polysynthetic Thermal compound sold by Arctic Silver, Inc., Vistalia, Calif., a metallic foil, a conductive pad, or similar medium. The medium is mechanically resilient such that the Peltier modules 24 do not come under stress under thermal expansion and contraction effects due to temperature cycling.

In addition to the benefits realized by allowing the Peltier modules 24 to float in the space between the top plate 12 and the heat sink assembly 14, the spacer configuration provides a thermally stable chuck structure. The change in flatness of the top surface over a typical testing temperature range is limited to the initial ambient flatness. The rigidity also lowers the deflection caused by high wafer probing forces during test contact.

Referring to FIG. 3, the top vacuum plate 12 and the heat sink assembly 14 are held together by threaded screws 26. The screws thread into threaded holes 31 in the top vacuum plate 12. A nut or head captures washers 29 in a recess or counter bore formed in the bottom of the heat sink assembly 14. It should be noted that the details of FIG. 3 are applicable to all of the embodiments of the invention described herein.

Figure 4:
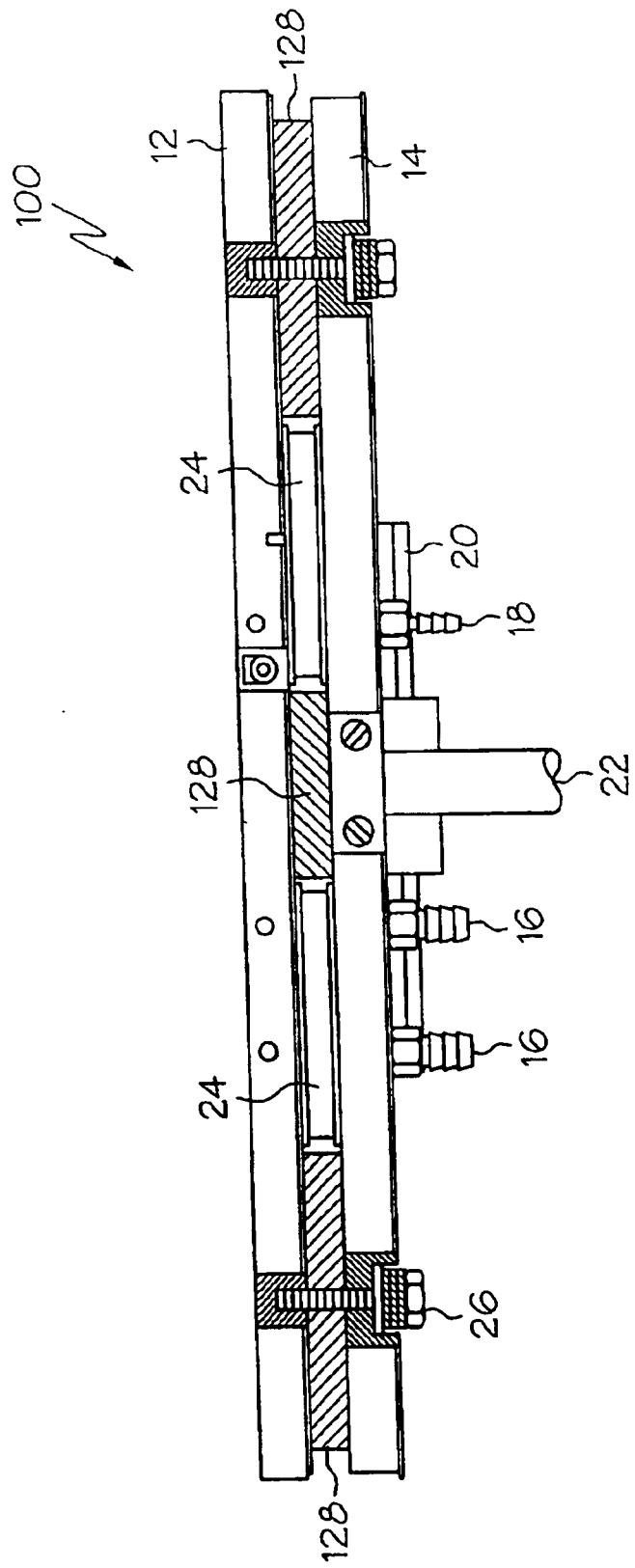
FIG. 4 is a schematic cross-sectional view of a workpiece chuck in accordance with a second embodiment of the present invention.
Figure 5:
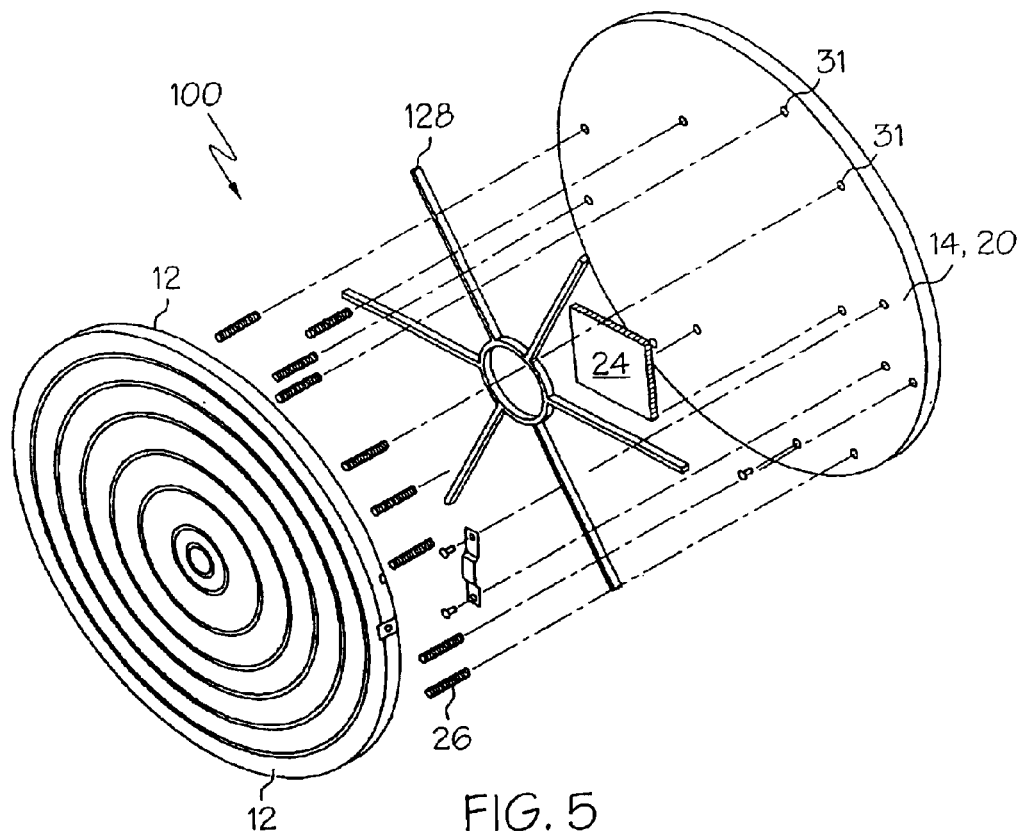
FIG. 5 is a schematic exploded view of a portion of the workpiece chuck shown in FIG. 4.
Figure 6:
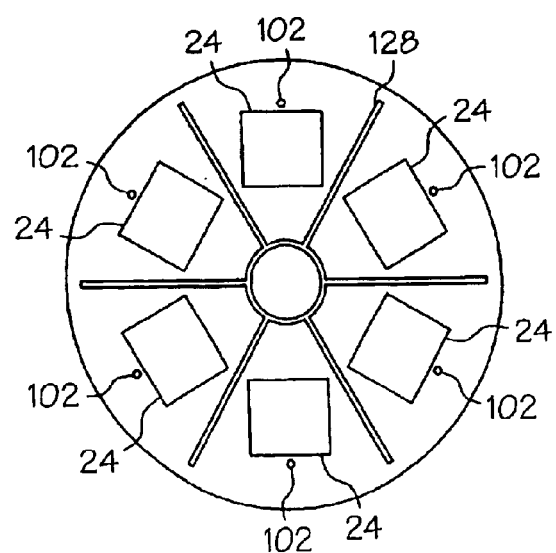
FIG. 6 is a schematic plan view of an array of thermoelectric modules in the workpiece chuck of FIGS. 4 and 5.

FIG. 4 is a schematic cross-sectional view of a workpiece chuck 100 in accordance with a second embodiment of the present invention. FIG. 5 is a schematic exploded view of the chuck 100 of FIG. 4. FIG. 6 is a schematic plan view illustrating a Peltier module array and spacer configuration used in the chuck of FIGS. 4 and 5. Description of elements which are the same as those of the first embodiment will be omitted. Referring to FIGS. 4 through 6, the top vacuum plate 12 and heat sink assembly 14 are separated by a unitary spacer 128, instead of the multiple spacers used in the previously described embodiment. The unitary "star" spacer 128 is made of a ceramic or similar non-conductive, low thermal expansion material. The unitary spacer 128 includes a plurality of radial arms which extend between the Peltier modules 24 from the center of the spacer 128 toward the edges of the chuck 100. Once again, as in the previous embodiment, the thickness of the spacer 128 defines the space between the top surface plate 12 and the heat sink assembly 14. The thickness is selected to allow the Peltier modules 24 to float during temperature transitions to reduce mechanical stress, thus increasing life and reliability of the modules 24. The one-piece unitary spacer 128 has thin vertical sections and includes cutouts to minimize thermal conductivity between the top vacuum plate 12 and the heat sink assembly 14 and also to provide electrical interconnection clearance. The configuration also includes pin inserts 102 on the heat sink assembly 14 to prevent excessive position shift of the modules 24 during temperature transitions.

In one embodiment, the size of the Peltier modules is effectively reduced. In one embodiment, the modules are as small as physically possible. The modules are of a reduced size. Using small and/or segmented modules effectively reduces the size of the modules, but allows for convenient electrical connection. In one particular embodiment illustrated herein, the modules are segmented into four smaller modules by cutting the module surface. The segmenting may be done in such a way as to create many more discrete modules. Reducing the size of the modules decreases the mechanical stress within the module by reducing the differential expansion between the top and bottom ceramic layers of the modules.

Figure 7:
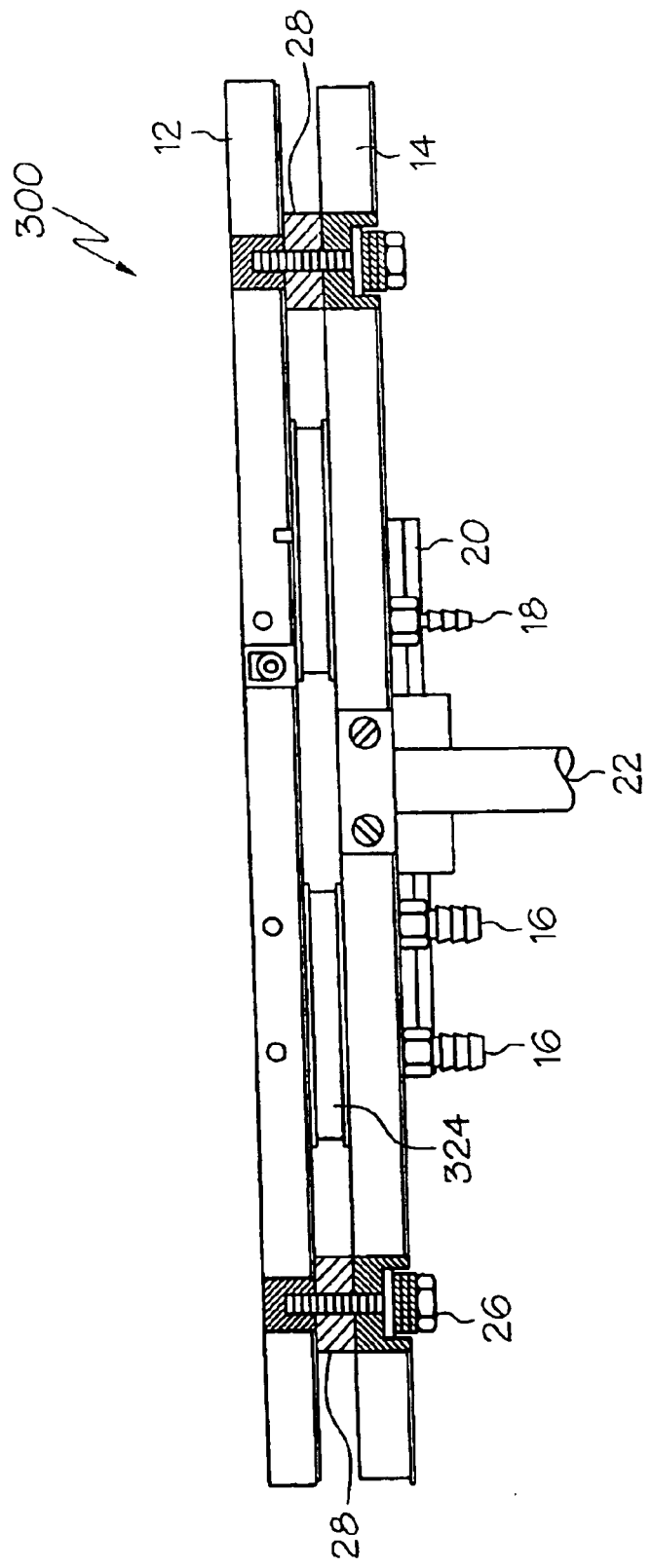
FIG. 7 is a schematic cross-sectional view of a workpiece chuck in accordance with a third embodiment of the present invention.
Figure 8:
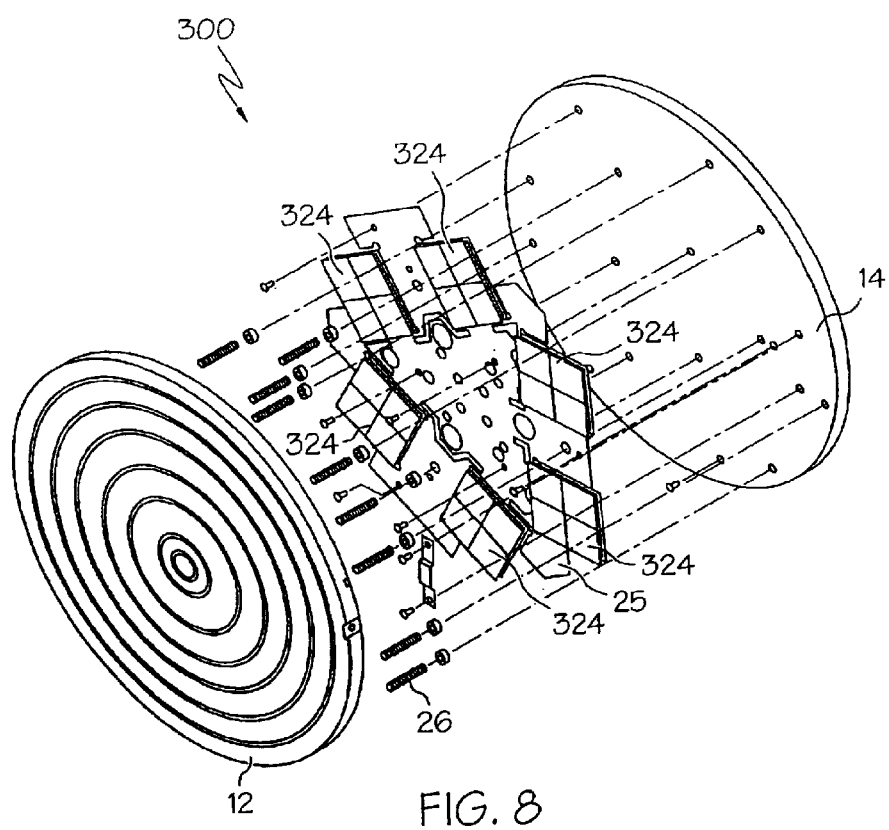
FIG. 8 is a schematic exploded view of a portion of the workpiece chuck of FIG. 7.

FIG. 7 contains a schematic cross-sectional view of an embodiment of a workpiece chuck 300 FIG. 8 contains a schematic exploded view of the chuck 300 shown in FIG. 7. In the chuck 300 of FIGS. 7 and 8, most of the elements are the same as those in embodiments of the chuck described above in connection with FIGS. 1 through 3. Therefore, description of those elements will not be repeated. In the chuck 300, the thermoelectric modules 324 are of effectively reduced size. In particular, in the chuck 300, the thermoelectric modules are segmented such as by forming cuts in the ceramic on either the top or bottom of the modules 324. Alternatively, multiple smaller modules can be used instead of or in addition to the segmented modules.

Figure 9:
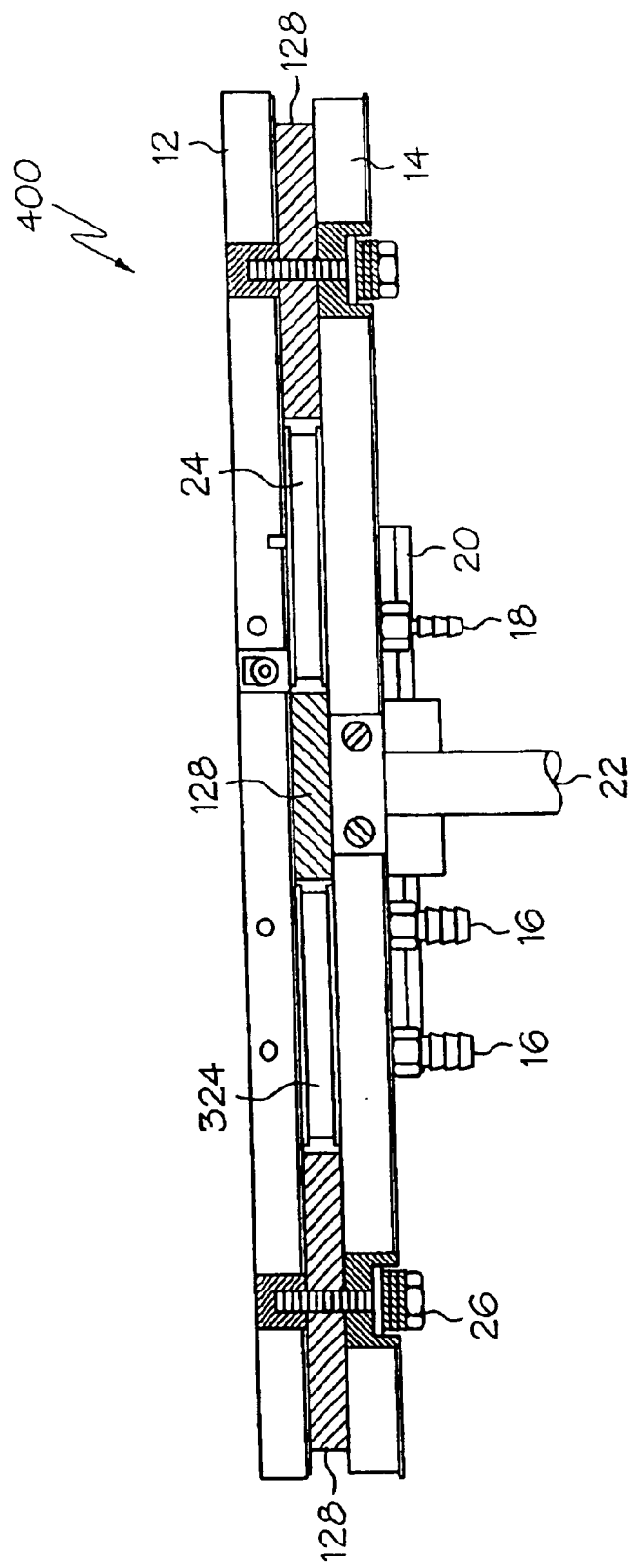
FIG. 9 is a schematic cross-sectional view of a workpiece chuck in accordance with a fourth embodiment of the present invention.
Figure 10:
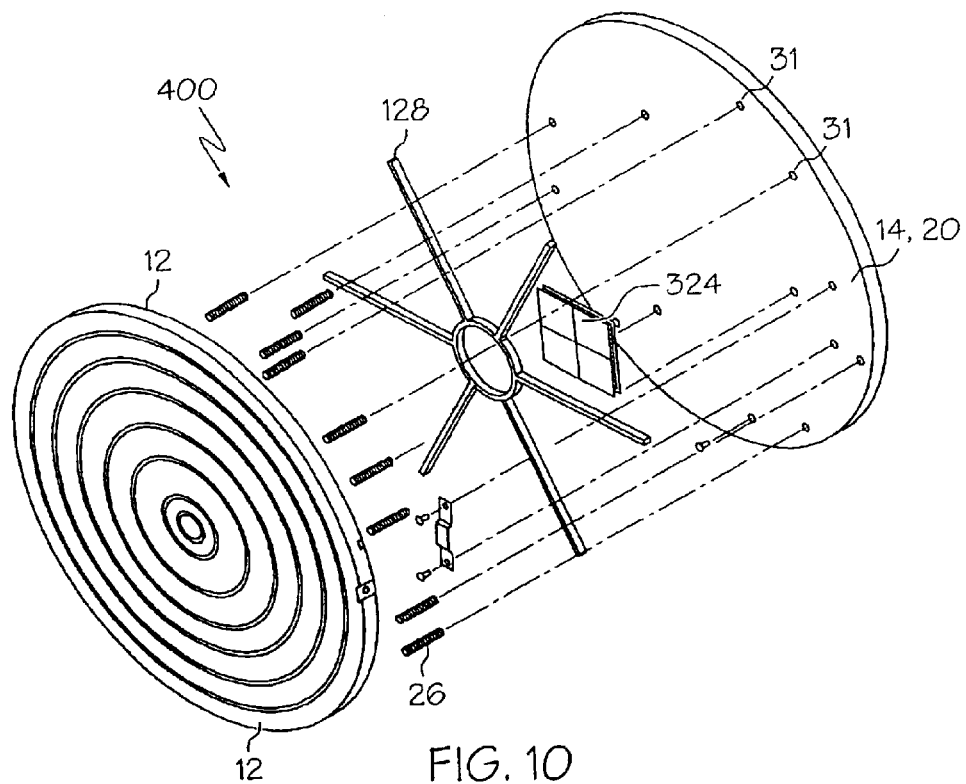
FIG. 10 is a schematic exploded view of a portion of the workpiece chuck shown in FIG. 9.
Figure 11:
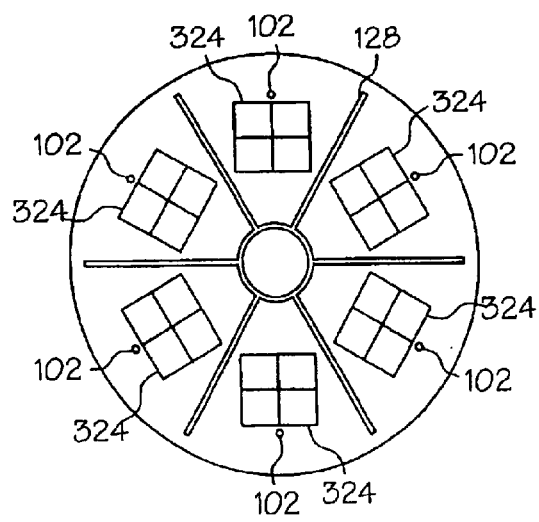
FIG. 11 is a schematic plan view of an array of thermoelectric modules in the workpiece chuck of FIGS. 9 and 10.

FIG. 9 contains a schematic cross-sectional view of a workpiece chuck 400 in accordance with another embodiment of the present invention. FIG. 10 is a schematic exploded view of the chuck 400 of FIG. 9. FIG. 11 is a schematic plan view illustrating a Peltier module array and spacer configuration used in the chuck of FIGS. 9 and 10. In the chuck 400 of FIGS. 9 through 11, most of the elements are the same as those in embodiments of the chuck described above in connection with FIGS. 4 through 6. Therefore, description of those elements will not be repeated. In the chuck 400, the thermoelectric modules 324 are of effectively reduced size. In particular, in the chuck 400, the thermoelectric modules are segmented such as by forming cuts in the ceramic on either the top or bottom of the modules 324. Alternatively, multiple smaller modules can be used instead of or in addition to the segmented modules.

FIG. 12 contains a schematic detailed view of two embodiments 324*a* and 324*b* of thermoelectric modules 324 used in the workpiece chucks of FIGS. 6 through 11. The embodiment 324*a* is a segmented thermoelectric module, and the embodiment 324*b* contains multiple small thermoelectric modules. In the embodiment 324*a*, a single silicone elastomer sealed thermoelectric module includes a segmented hot side only, which allows for relative movement of the hot side segments during temperature transitions, resulting in reduced risk of failure of the device and improved reliability. In the embodiment 324*b*, multiple silicone elastomer sealed thermoelectric modules are used, resulting in allowing relative movement of the modules during temperature transitions.

FIG. 13 contains schematic cross-sectional views of the thermoelectric module embodiments illustrated in FIG. 12. As shown in FIG. 13, the segmented module includes a hot side ceramic 151 and a cold side ceramic 154 with the Peltier elements 153 interposed between the ceramic layers. The hot side ceramic layer 151 includes relief cuts 155 which segment the module 324*a* into multiple smaller segments. The module embodiment 324*b* includes multiple smaller modules 324*b*(1), 324*b*(2), etc. The modules 324 are sandwiched between the top surface 12 and heat sink 14 of the chuck.

Figure 14A:
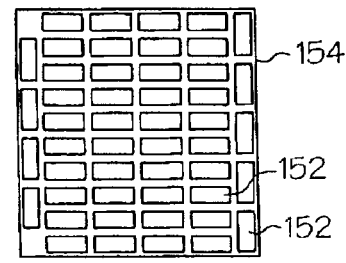
FIGS. 14A through 14E are detailed drawings illustrating electrical connections of one embodiment of a segmented thermoelectric module in accordance with the invention.
Figure 14D:
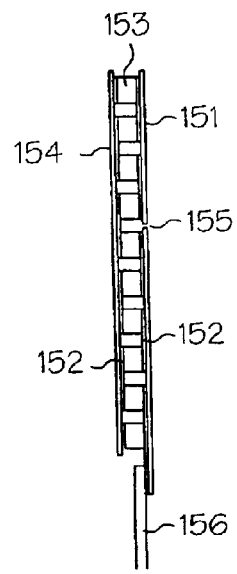
Figure 14B:
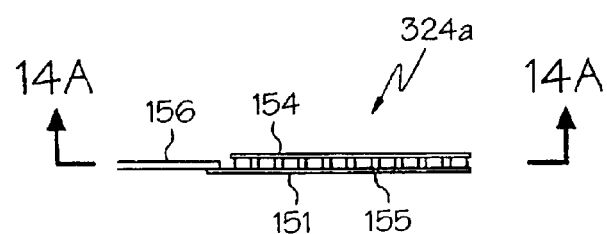
Figure 14C:
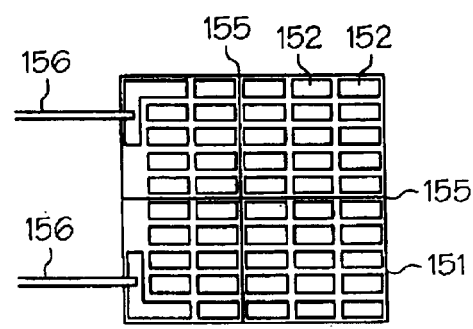
Figure 14E:
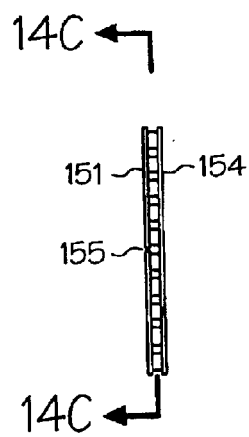

FIGS. 14A through 14E are detailed drawings illustrating electrical connections of one embodiment of a segmented thermoelectric module 324*a* in accordance with the invention. FIGS. 14B and 14E are schematic cross-sectional views of the module 324*a*, and FIG. 14D is an enlarged view of FIGS. 14B and 14E. FIG. 14A is a plan view of the cold side ceramic layer 154, taken along line B—B of FIG. 14B. The cold side ceramic layer 154 includes a pattern of conductive pads 152 which are used in making electrical connections to the Peltier elements 153. FIG. 14C is a plan view of the hot side ceramic layer 151, taken along line A—A of FIG. 14E. As shown in FIG. 14C, the hot side ceramic layer 151 also includes a pattern of conductive pads 152 used in making the electrical connections to the Peltier elements 153. When the cold and hot side layers are brought together and aligned with the elements 153 interposed therebetween, the elements 153 are connected in an electrical series configuration, as shown more clearly in FIG. 14D. Lead wires 156 provide for the external electrical connection to the module 324*a*. The hot side ceramic layer 151 also includes the relief cuts 155 which mechanically segment the hot side ceramic layer into multiple segments, while leaving the conductive pads intact such that the electrical series interconnection of the Peltier elements is not interrupted. As a result, the configuration achieves the mechanical benefits of the effectively smaller Peltier modules as described above, while still requiring the same electrical interface as the larger single non-segmented module.

FIG. 15 contains a schematic detailed cross-sectional view of a segmented thermoelectric module 324*a* in accordance with the invention. The detail of FIG. 15 illustrates the relief cut 155 in the hot side ceramic layer 151. It also illustrates the Peltier elements 153 interposed between the hot side ceramic layer 151 and the cold side layer 154. The electrical series connection pads 152 are also shown contacting the ceramic layers and the Peltier elements 153 such that the elements are connected in the series electrical configuration.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A workpiece chuck for supporting a workpiece, comprising:

a top layer on which the workpiece can be mounted; and a temperature control assembly in thermal communication with the top layer to control temperature in the workpiece, the temperature control assembly comprising:

an upper layer, a lower layer, and
  at least one thermoelectric module disposed between the upper layer and the lower layer of the temperature control assembly, wherein the at least one thermoelectric module is segmented into a plurality of segments.

2. The workpiece chuck of claim 1, wherein the segments are electrically connected together.

3. The workpiece chuck of claim 1, wherein the segments are electrically connected together in series.

4. The workpiece chuck of claim 1, wherein the at least one thermoelectric module comprises a top surface and a bottom surface, at least one of the top and bottom surfaces being segmented.

5. The workpiece chuck of claim 4, wherein the segments are electrically connected together by a conductor on at least one of the top and bottom surfaces.

6. The workpiece chuck of claim 4, wherein the segments are electrically connected together in series by a conductor on at least one of the top and bottom surfaces.

7. The workpiece chuck of claim 1, further comprising at least one spacer between the upper layer and the lower layer of the temperature control assembly, the at least one spacer vertically spacing the upper layer and the lower layer of the temperature control assembly such that the at least one thermoelectric module vertically floats in a space between the upper layer and the lower layer of the temperature control assembly.

8. The workpiece chuck of claim 7, further comprising a thermally conductive medium in the space for thermally coupling the at least one thermoelectric module to the upper layer and the lower layer of the temperature control assembly.

9. The workpiece chuck of claim 8, wherein the thermally conductive medium comprises a thermal grease.

10. The workpiece chuck of claim 1, wherein the at least one thermoelectric module comprises a Peltier device.

11. The workpiece chuck of claim 2, wherein the upper layer and the lower layer of the temperature control assembly are fastened together by a plurality of screws.

12. The workpiece chuck of claim 11, wherein the at least one spacer comprises a clearance hole through which one of the screws passes.

13. The workpiece chuck of claim 11, wherein the at least one spacer comprises a plurality of arms extending radially between the center and edges of the temperature control assembly.

14. The workpiece chuck of claim 1, wherein the workpiece is a semiconductor wafer.

15. A workpiece chuck for supporting a workpiece, comprising:
  a top layer on which the workpiece can be mounted; and
  a temperature control assembly in thermal communication with the top layer to control temperature in the workpiece, the temperature control assembly comprising:
    an upper layer,
    a lower layer, and
    at least one thermoelectric module disposed between the upper layer and the lower layer of the temperature control assembly, wherein the at least one thermoelectric module comprises a plurality of thermoelectric submodules.

16. The workpiece chuck of claim 15, wherein the submodules are electrically connected together.

17. The workpiece chuck of claim 15, wherein the submodules are electrically connected together in series.

18. The workpiece chuck of claim 15, wherein each of the submodules comprises a top surface and a bottom surface.

19. The workpiece chuck of claim 18, wherein the submodules are electrically connected together by a conductor on at least one of the top and bottom surfaces.

20. The workpiece chuck of claim 18, wherein the submodules are electrically connected together in series by a conductor on at least one of the top and bottom surfaces.

21. The workpiece chuck of claim 15, further comprising at least one spacer between the upper layer and the lower layer of the temperature control assembly, the at least one spacer vertically spacing the upper layer and the lower layer of the temperature control assembly such that the at least one thermoelectric module vertically floats in a space between the upper layer and the lower layer of the temperature control assembly.

22. The workpiece chuck of claim 21, further comprising a thermally conductive medium in the space for thermally coupling the at least one thermoelectric module to the upper layer and the lower layer of the temperature control assembly.

23. The workpiece chuck of claim 22, wherein the thermally conductive medium comprises a thermal grease.

24. The workpiece chuck of claim 15, wherein the at least one thermoelectric module comprises a Peltier device.

25. The workpiece chuck of claim 21, wherein the upper layer and the lower layer of the temperature control assembly are fastened together by a plurality of screws.

26. The workpiece chuck of claim 25, wherein the at least one spacer comprises a clearance hole through which one of the screws passes.

27. The workpiece chuck of claim 25, wherein the at least one spacer comprises a plurality of arms extending radially between the center and edges of the temperature control assembly.

28. The workpiece chuck of claim 15, wherein the workpiece is a semiconductor wafer.

29. A method of supporting a workpiece with a workpiece chuck, comprising:
  providing a top layer of the workpiece chuck on which the workpiece can be mounted; and
  providing a temperature control assembly in thermal communication with the top layer to control temperature in the workpiece, the temperature control assembly comprising:
    an upper layer,
    a lower layer,
    at least one thermoelectric module disposed between the upper layer and the lower layer of the temperature control assembly, wherein the at least one thermoelectric module is segmented into a plurality of segments.

30. The method of claim 29, wherein the segments are electrically connected together.

31. The method of claim 29, wherein the segments are electrically connected together in series.

32. The method of claim 29, wherein the at least one thermoelectric module comprises a top surface and a bottom surface, at least one of the top and bottom surfaces being segmented.

33. The method of claim 32, wherein the segments are electrically connected together by a conductor on at least one of the top and bottom surfaces.

34. The method of claim 32, wherein the segments are electrically connected together in series by a conductor on at least one of the top and bottom surfaces.

35. The method of claim 29, wherein the temperature control assembly further comprises at least one spacer between the upper layer and the lower layer of the temperature control assembly, the at least one spacer vertically spacing the upper layer and the lower layer of the temperature control assembly such that the at least one thermoelectric module vertically floats in a space between the upper layer and the lower layer of the temperature control assembly.

36. The method of claim 35, further comprising providing a thermally conductive medium in the space for thermally coupling the at least one thermoelectric module to the upper layer and the lower layer of the temperature control assembly.

37. The method of claim 29, wherein the workpiece is a semiconductor wafer.

38. A method of supporting a workpiece with a workpiece chuck, comprising:
   providing a top layer of the workpiece chuck on which the workpiece can be mounted; and
   providing a temperature control assembly in thermal communication with the top layer to control temperature in the workpiece, the temperature control assembly comprising:
   an upper layer,
   a lower layer,
   at least one thermoelectric module disposed between the upper layer and the lower layer of the temperature control assembly, wherein the at least one thermoelectric module comprises a plurality of thermoelectric submodules.

39. The method of claim 38, wherein the submodules are electrically connected together.

40. The method of claim 38, wherein the submodules are electrically connected together in series.

41. The method of claim 38, wherein each of the submodules comprises a top surface and a bottom surface.

42. The method of claim 41, wherein the submodules are electrically connected together by a conductor on at least one of the top and bottom surfaces.

43. The method of claim 41, wherein the submodules are electrically connected together in series by a conductor on at least one of the top and bottom surfaces.

44. The method of claim 38, wherein the temperature control assembly further comprises at least one spacer between the upper layer and the lower layer of the temperature control assembly, the at least one spacer vertically spacing the upper layer and the lower layer of the temperature control assembly such that the at least one thermoelectric module vertically floats in a space between the upper layer and the lower layer of the temperature control assembly.

45. The method of claim 44, further comprising providing a thermally conductive medium in the space for thermally coupling the at least one thermoelectric module to the upper layer and the lower layer of the temperature control assembly.

46. The method of claim 38, wherein the workpiece is a semiconductor wafer.

* * * * *